United States Patent
Nishimura et al.

(10) Patent No.: US 8,039,396 B2
(45) Date of Patent: Oct. 18, 2011

(54) METHOD FOR MANUFACTURING PHOTOVOLTAIC DEVICE

(75) Inventors: Kunihiko Nishimura, Tokyo (JP); Shigeru Matsuno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 43 days.

(21) Appl. No.: 12/531,905

(22) PCT Filed: Dec. 20, 2007

(86) PCT No.: PCT/JP2007/074510
§ 371 (c)(1),
(2), (4) Date: Sep. 18, 2009

(87) PCT Pub. No.: WO2009/016776
PCT Pub. Date: Feb. 5, 2009

(65) Prior Publication Data
US 2010/0120188 A1    May 13, 2010

(30) Foreign Application Priority Data
Jul. 31, 2007    (JP) .................................. 2007-199009

(51) Int. Cl.
*H01L 21/461* (2006.01)

(52) U.S. Cl. ................................ 438/690; 257/E21.231

(58) Field of Classification Search .................... 438/57, 438/637, 690, 494, 498, 689; 257/E31.001, 257/E21.231
See application file for complete search history.

(56) References Cited

U.S. PATENT DOCUMENTS

| | | | |
|---|---|---|---|
| 6,228,181 B1 | 5/2001 | Yamamoto et al. | |
| 2002/0119290 A1 | 8/2002 | Park et al. | |
| 2006/0027804 A1* | 2/2006 | Yamazaki et al. | 257/59 |

FOREIGN PATENT DOCUMENTS

| | | |
|---|---|---|
| JP | 62 145819 | 6/1987 |
| JP | 3 89518 | 4/1991 |
| JP | 10-027918 | 1/1998 |
| JP | 10 335687 | 12/1998 |
| JP | 10-335687 | 12/1998 |
| JP | 11 238689 | 8/1999 |

(Continued)

OTHER PUBLICATIONS

Office Action issued Dec. 16, 2010, in Japanese Patent Application No. 2009-525263, filed Jul. 9, 2009.

*Primary Examiner* — Thomas L Dickey
*Assistant Examiner* — Nikolay Yushin
(74) *Attorney, Agent, or Firm* — Oblon, Spivak, McClelland, Maier & Neustadt, L.L.P.

(57) ABSTRACT

Provided is a method for manufacturing a photovoltaic device which is capable of easily forming a texture having an aspect ratio larger than 0.5. The method for manufacturing a photovoltaic device include the steps of: forming an etching-resistant film on a silicon substrate; forming a plurality of fine holes in the etching-resistant film with an irradiated laser beam which has a focal depth adjusted to 10 μm or more to expose a surface of the silicon substrate which is a base layer; and etching the exposed surface of the silicon substrate, in which the step of exposing the surface of the silicon substrate includes forming a fine recess at a concentric position to each of the fine holes in the surface of the silicon substrate which lies under the etching-resistant film.

12 Claims, 5 Drawing Sheets

FOREIGN PATENT DOCUMENTS

| | | |
|---|---|---|
| JP | 2001 68702 | 3/2001 |
| JP | 2001-345468 | 12/2001 |
| JP | 2001 345468 | 12/2001 |
| JP | 2002 217439 | 8/2002 |
| JP | 2003 258285 | 9/2003 |
| JP | 2003 309276 | 10/2003 |
| JP | 2004-047776 | 2/2004 |
| JP | 2004 47776 | 2/2004 |
| JP | 2007 219488 | 8/2007 |

* cited by examiner (a) STEP 1

(b) STEP 2

(c) STEP 3

(d) STEP 4

F I G. 5
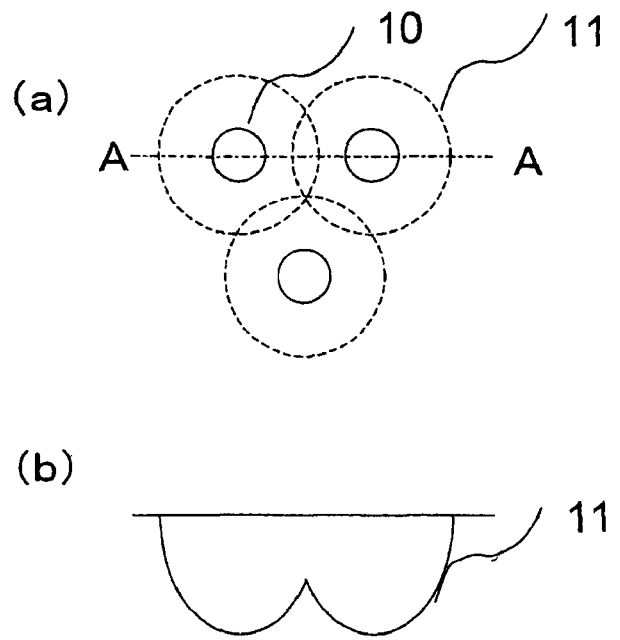
F I G. 6
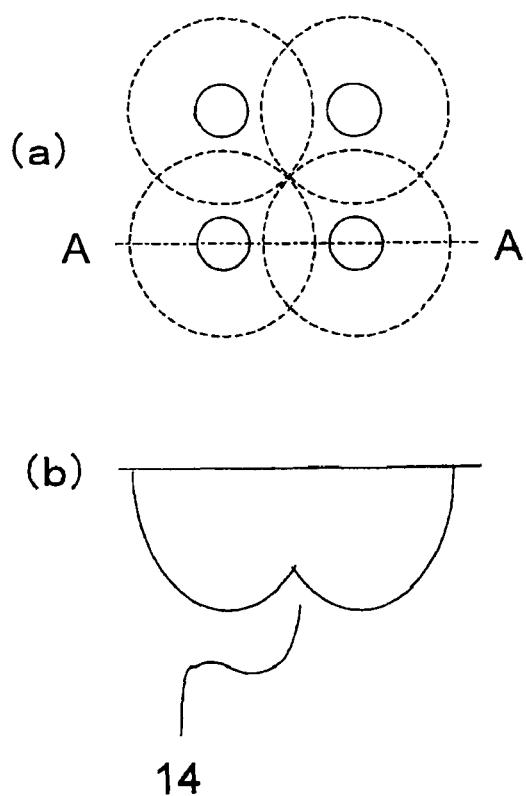

US 8,039,396 B2

METHOD FOR MANUFACTURING PHOTOVOLTAIC DEVICE

TECHNICAL FIELD

The present invention relates to a method for manufacturing a photovoltaic device, and more particularly, to a method for manufacturing a photovoltaic device in which a light reflectance on a substrate surface is reduced to increase the amount of light absorption, to thereby obtain excellent photoelectric conversion efficiency.

BACKGROUND ART

In order to improve the performance of a photovoltaic device such as a solar battery, it is important to efficiently introduce sunlight into an inner portion of a substrate of the solar battery. Therefore, a light incident side surface of the substrate is subjected to texture processing, and hence light reflected on the surface is made incident on the surface again. Thus, more sunlight is introduced into the inner portion of the substrate to improve photoelectric conversion efficiency. The texture processing refers to processing for forming intentional fine unevenness having a size in a range of several tens nm to several tens μm in the surface of the substrate.

Anisotropic etching is widely employed as a method of forming a texture in a solar battery substrate in a case where the substrate is a single-crystalline substrate. The anisotropic etching depends on the crystal orientation and uses an alkali aqueous solution which contains sodium hydroxide or potassium hydroxide and has the dependence of etching rate on a crystal orientation. For example, when a surface of the substrate which is a (100) plane is anisotropically etched, a pyramid texture in which the (111) plane is exposed is formed.

However, when a polycrystalline substrate is employed as the substrate in the anisotropic etching method using the alkali aqueous solution, only a partial texture structure may be formed because the etching rate is significantly changed according to crystal planes and crystal plane orientations are not aligned. Therefore, there is a limit on reducing a reflectance, which leads to a problem. For example, a reflectance at a wavelength of 628 nm is approximately 36% in a case of silicon having a mirror-polished surface. When a single-crystalline silicon substrate with a (100) plane is wet-etched, the reflectance is approximately 15%. When a polycrystalline silicon substrate is wet-etched, the reflectance is approximately 27% to 30%.

Therefore, mixed acid etching using an etching-resistant mask has been proposed as a method of forming a texture structure in the entire surface without depending on crystal plane orientations. A lithography method used for a semiconductor process may be employed as an etching mask producing method, but the method is not suitable to manufacture a solar battery because a manufacturing cost is high. Thus, there has been proposed a method of mixing a fine particle having a low etching resistance into a solution containing an etching-resistant material and coating a substrate surface with the resultant mixture to produce the etching-resistant mask. Then, a texture is formed using fluoronitric acid capable of isotropic etching in different crystal plane orientations (see, for example, Patent Document 1).

Alternatively, there has also been proposed a method of directly forming a texture in a silicon substrate by laser processing (see, for example, Patent Document 2).

Patent Document 1: JP 2003-309276 A
Patent Document 2: JP 03-89518 A

DISCLOSURE OF THE INVENTION

Problems to be Solved by the Invention

However, the etching using fluoronitric acid has a problem that a deep texture may not be formed because of the isotropy of the etching. That is, the progress of etching in the lateral direction is equal to the progress of etching in the depth direction, and hence an etching shape is hemispherical. Assume that a depth/diameter ratio of the etching shape is defined as an aspect ratio. In the case of isotropic etching, a shape having an aspect ratio larger than 0.5 may not be formed. In an actual case, an aperture diameter of the etching-resistant mask is added to the diameter of the etching shape, and hence only an aspect ratio equal to or smaller than 0.5 is obtained.

A purpose of forming the texture is the reintroduction of reflected light, and hence it is necessary to reflect the reflected light again at an angle for reaching a substrate surface. When the aspect ratio of the texture is low, only reflected light with a large angle relative the normal to the substrate surface may be incident on the substrate surface again.

In contrast to this, when the texture is directly formed with a laser, there is an advantage that the aspect ratio may be freely set. However, there is a problem that a time required for the processing is not practical. The processing time for forming the texture increases with an increase in desired aspect ratio.

The present invention has been made in view of the points described above. An object of the present invention is to provide a method for manufacturing a photovoltaic device which is capable of easily forming a texture having an aspect ratio larger than 0.5.

Means for Solving the Problems

According to the present invention, there is provided a method for manufacturing a photovoltaic device, including the steps of: forming an etching-resistant film on a silicon substrate; forming a plurality of fine holes in the etching-resistant film with an irradiated laser beam to expose a surface of the silicon substrate which is a base layer; and etching the exposed surface of the silicon substrate, in which the step of exposing the surface of the silicon substrate includes forming a fine recess in the surface of the silicon substrate which is exposed at bottom portions of the fine holes.

Effects of the Invention

According to the present invention, the silicon substrate is etched through the plurality of fine holes provided in the etching-resistant film, and hence the fine recesses are further formed in the exposed surface of the silicon substrate. Therefore, a deep texture having an aspect ratio larger than 0.5 may be formed on the silicon substrate within a short time without being influenced by the crystal plane orientation. Thus, a photovoltaic device having a surface reflection loss is small may be manufactured.

BRIEF DESCRIPTION OF THE DRAWINGS

FIG. 5 Diagrams each illustrating a relationship between openings formed at triangular grid points and etching holes formed by etching a silicon substrate (case where outlines of etching holes adjacent to each other in each of lateral and longitudinal directions are in contact with one another).

FIG. 6 Diagrams each illustrating a relationship between the openings formed at rectangular grid points and the etching holes formed by etching the silicon substrate (case where outlines of openings adjacent to each other in each of lateral and longitudinal directions overlap each other).

BEST MODE FOR CARRYING OUT THE INVENTION

Embodiment 1

First, materials and an apparatus which are used for a method for manufacturing a photovoltaic device according to Embodiment 1 of the present invention are described. A silicon substrate is a polycrystalline silicon substrate which is most widely used for consumer solar batteries, which is obtained by slicing a polycrystalline silicon ingot by a multi-wire saw and then removing a damage resulting from the slicing by wet etching with an acid or alkali solution. A substrate thickness and a substrate size after the removal of the damage are 250 μm and 150 mm×150 mm, respectively.

A film having an etching resistance (hereinafter referred to as "etching-resistant film") formed on the silicon substrate is a silicon nitride film (hereinafter referred to as "SiN film") formed at a film thickness of 240 nm by a plasma CVD method. In this embodiment, the SiN film is used. A silicon oxide ($SiO_2$ or SiO) film, a silicon oxynitride (SiON) film, an amorphous silicon (a-Si) film, a diamond-like carbon film, or a resin film may also be used.

Figure 1:
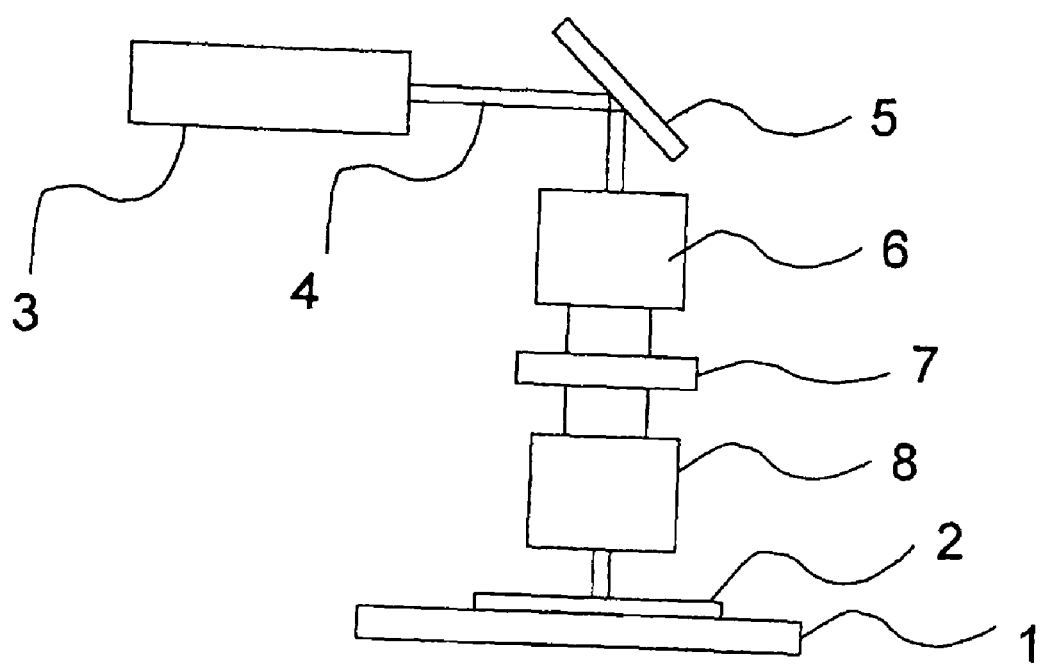
FIG. 1 An explanatory diagram illustrating an optical system of an apparatus for forming a plurality of openings in an etching-resistant film, which is used for a method for manufacturing a photovoltaic device according to Embodiment 1 of the present invention.

FIG. 1 is an explanatory diagram illustrating an optical system of an apparatus for forming a plurality of openings in the etching-resistant film, which is used for the method for manufacturing the photovoltaic device according to Embodiment 1 of the present invention. In the apparatus illustrated in FIG. 1, a laser beam 4 emitted from a laser oscillation device 3 travels on an optical path changed by a reflecting mirror 5, and then enlarged by a beam splitter 6 to be made incident on an aperture 7. An etching-resistant film 2 which is an object to be processed is irradiated with the laser beam passing through the aperture 7 and a reduction optical system 8. As a result, a plurality of openings which are a plurality of fine holes are formed in the etching-resistant film 2 provided on a silicon substrate 1 to expose the surface of the silicon substrate 1 which is a base layer.

In Embodiment 1, a combination of an Nd:YAG laser and a three-times harmonic generator is used as the laser oscillation device 3. As a result, the wavelength of the light beam is 355 nm, which allows the SiN film to absorb the light beam. A focal depth of the optical system is set to 10 μm or more. An intensity capable of removing the SiN film and forming recesses in the silicon substrate 1 which is the base layer is selected as the intensity of the laser beam. As a result of studies made by the inventors of the present invention, it was found that the openings may be formed in the SiN film at a laser beam intensity of 0.4 $J/cm^2$ or more and the silicon substrate 1 which is the base layer may be recessed at a laser beam intensity of 2 $J/cm^2$ or more. In this embodiment, a laser beam intensity of 3 $J/cm^2$ is used.

A metal plate having an opening is used as the aperture 7. The laser beam passing through the aperture 7 is reduced to irradiate the object to be processed, and hence an opening pattern of the aperture 7 may be relatively large. Therefore, a metal plate having an opening formed by wet etching or sandblast may also be used. Alternatively, a glass mask in which a pattern of a metal thin film such as a chromium film is formed on a glass substrate may also be used. In this case, it is necessary to give consideration to a transmittance of glass and a tolerance of the metal thin film.

Figure 2:
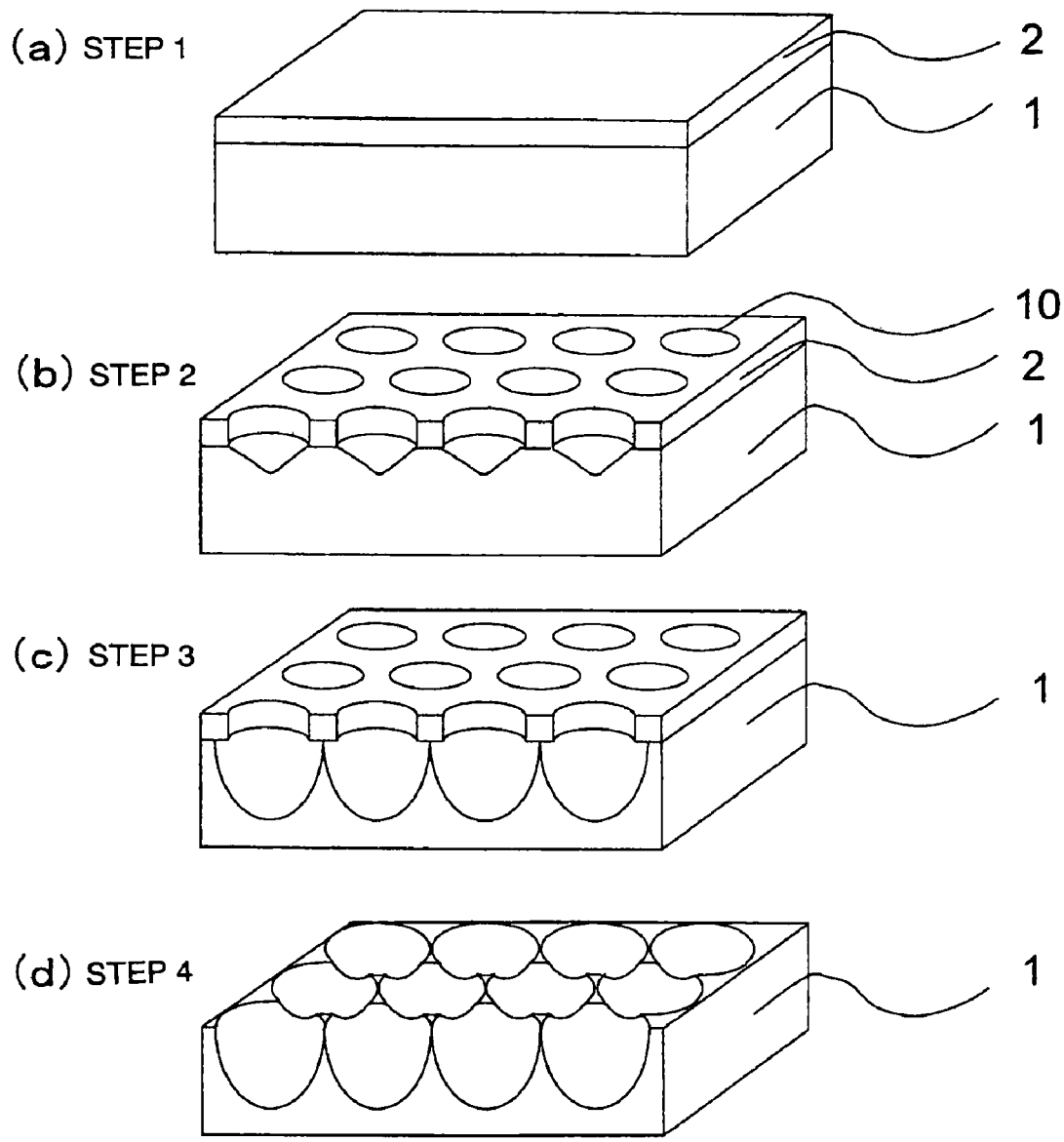
FIG. 2 Diagrams each illustrating a part of steps of the method for manufacturing the photovoltaic device according to Embodiment 1 of the present invention.

FIG. 2 illustrates a part of steps of the method for manufacturing the photovoltaic device according to Embodiment 1 of the present invention. In Step 1 illustrated in FIG. 2(a), the etching-resistant film 2 is formed on the silicon substrate 1. In Step 2 illustrated in FIG. 2(b), a part of the laser beam is blocked by a light shielding mask having a light transmission portion and a light blocking portion which correspond to the plurality of openings, while directly forming a plurality of openings 10 in the etching-resistant film 2 at the same time. In Embodiment 1, the plurality of openings 10 formed in the etching-resistant film 2 are provided at rectangular grid points.

With respect to the surface of the polycrystalline silicon substrate, there is unevenness of approximately 5 μm on a surface obtained by cutting with the wire saw. Even when etching using an alkali solution is performed, the same pyramid or reverse pyramid step is caused because of the dependence of an etching rate on a plane orientation. The step reaches approximately no less than 5 μm, depending on a processing condition. When the substrate 1 having the step is exposed using a normal exposure apparatus having a shallow focal depth, a pattern is deformed. In contrast to this, the optical system used in the present invention is set to emit a laser beam at an adjusted focal depth equal to or larger than 10 μm, and hence a desired pattern shape may be obtained.

In Step 3 illustrated in FIG. 2C, the patterned etching-resistant film 2 is used as a mask to etch the silicon substrate 1. A hydrofluoric acid-nitric acid mixture solution is used as an etching solution. The mixture ratio among hydrofluoric acid, nitric acid, and water is 1:20:10. The mixture ratio of the etching solution may be adjusted to a suitable mixture ratio in view of an etching rate and an etching shape.

Figure 3:
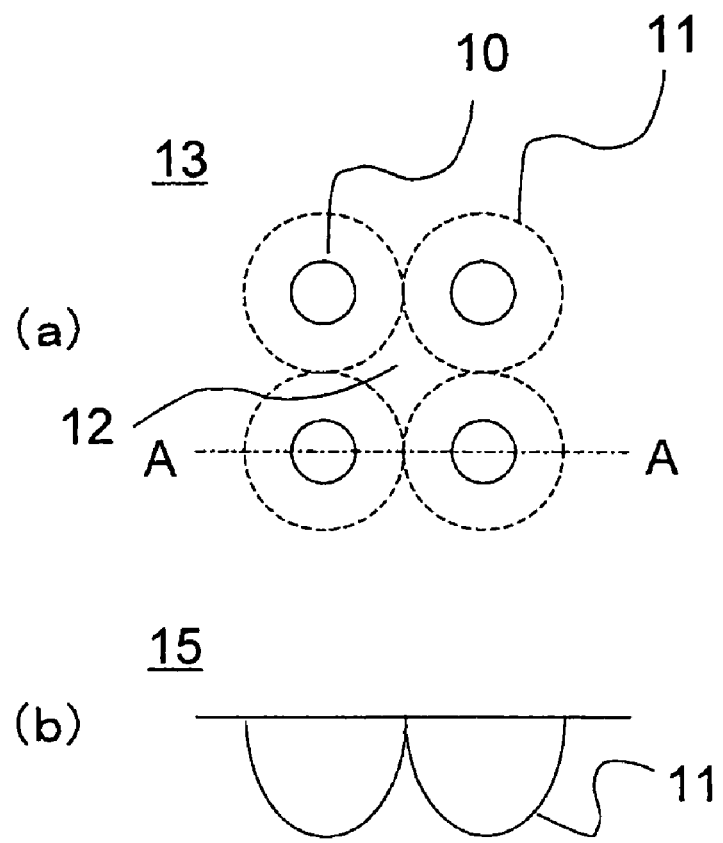
FIG. 3 Diagrams each illustrating a relationship between openings formed at rectangular grid points and etching holes formed by etching a silicon substrate (case where outlines of etching holes adjacent to each other in each of lateral and longitudinal directions are in contact with each other).

FIG. 3 illustrates a relationship between the openings (outer circumferences are indicated by the solid lines in FIG. 3(a)) 10 formed in the etching-resistant film 2 and etching holes (outer circumferences are indicated by the broken lines in FIG. 3(a)) 11 formed by etching the silicon substrate 1. FIG. 3(a) is a plan view illustrating the silicon substrate 1 viewed from the etching-resistant film 2 side. FIG. 3(b) is a cross sectional view taken along the line A-A of FIG. 3(a).

When the silicon substrate 1 is etched using fluoronitric acid, the silicon substrate 1 is isotropically etched. Therefore, as illustrated in FIG. 3(b), the etching holes 11 having a shape close to hemisphere or a shape close to a spheroid are obtained. As illustrated in FIG. 3(a), with respect to the obtained etching holes 11, the outlines of the etching holes 11 adjacent to each other in each of longitudinal and lateral directions are in contact with each other. In contrast to this, the outlines of the etching holes 11 adjacent to each other in each of diagonal directions are not in contact with each other, and hence a flat terrace portion 12 remains.

Figure 4:
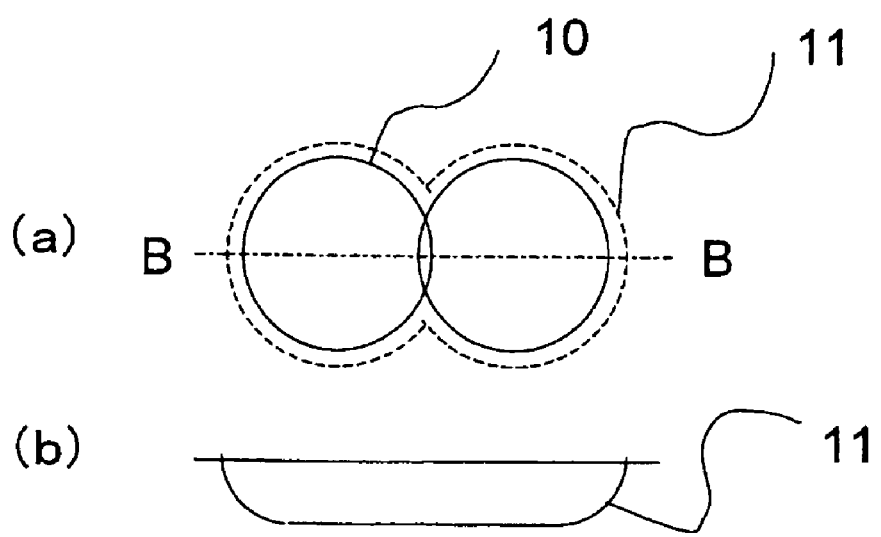
FIG. 4 Diagrams each illustrating a relationship between the openings formed at rectangular grid points and the etching holes formed by etching the silicon substrate (case where outlines of openings adjacent to each other in each of lateral and longitudinal directions are in contact with each other).

FIG. 4 illustrates a relationship between the openings formed at rectangular grid points and etching holes formed by etching the silicon substrate, in a case where the openings are adjacent to each other in each of lateral and longitudinal directions. FIG. 4(a) is a plan view illustrating the silicon substrate 1 viewed from the etching-resistant film 2 side. FIG. 4(b) is a cross sectional view taken along the line B-B of FIG. 4(a).

When a diameter of the openings 10 is larger than a center distance between the adjacent openings 10, as is apparent from the cross sections of the etching holes 11, there is no mountain between the two etching holes 11, and hence the etching holes 11 are connected as a single hole. Therefore, sufficient surface reflection reduction may not be realized. From this reason, in Embodiment 1, the diameter of the openings 10 is set so as to be smaller than the center distance between the adjacent openings 10. The diameter of the openings 10 is desirably equal to or smaller than 2 μm. The diameter of the openings 10 is added to the diameter of the etching holes 11 when calculating an aspect ratio (depth/diameter) of the etching holes 11, and hence a large opening diameter causes a reduction in the aspect ratio. In this embodiment, the diameter is set to 1 μm in view of the limitation of the optical system.

In Step 4 illustrated in FIG. 2(d), the etching-resistant film 2 is removed using hydrofluoric acid.

The subsequent steps are not illustrated, but are the same as normal steps of manufacturing a photovoltaic device using a polycrystalline silicon substrate. Therefore, the description is briefly made. After the processing of Step 4 is completed, the silicon substrate 1 is set in a thermal oxidation furnace and heated with phosphorus oxychloride ($POCl_3$) vapor. Thus, phosphorus glass is formed to diffuse phosphorus into the silicon substrate 1, to thereby form an N-layer. A diffusion temperature is set to 840° C.

Next, the phosphorus glass layer is removed in a hydrofluoric acid solution, and then SiN film is formed as an anti-reflective film by a plasma CVD method. A film thickness and a refractive index are set to values for minimizing light reflection. A film including two or more layers having different refractive indexes may be laminated.

Next, a paste mixed with silver is formed into a comb shape as an upper electrode by screen printing, a paste mixed with aluminum is formed as a rear electrode on the entire surface by screen printing, and baking treatment is performed. The baking is performed in an atmosphere at 760° C. Thus, the photovoltaic device is manufactured.

As described above, according to the method for manufacturing the photovoltaic device in Embodiment 1 of the present invention, the silicon substrate 1 is etched through the plurality of openings 10 formed in the etching-resistant film 2. Therefore, the etching holes 11 corresponding to fine unevenness which is not affected by the crystal plane orientation are formed in the silicon substrate 1, and hence a photovoltaic device having a small surface reflection loss may be manufactured.

In Step 3 for exposing the surface of the silicon substrate as illustrated in FIG. 2(c), the fine recesses are formed in the surface of the silicon substrate which is exposed at the bottom portions of the openings 10. Therefore, the etching holes 11 having the aspect ratio larger than 0.5 are formed, and hence a photovoltaic device having a small surface reflection loss may be manufactured. An example of a method of forming the etching holes having the aspect ratio larger than 0.5 is a reactive ion etching (RIE) method. In this case, the surface of the substrate is damaged by plasma. Thus, when the photovoltaic device is used as a solar battery cell, excellent characteristics are not obtained.

The diameter of the openings 10 is smaller than the center distance between the adjacent openings 10, and hence the openings 10 of the etching-resistant film 2 are not connected to each other and thus the etching holes 11 are not formed in a groove shape but in a separate recess shape. Therefore, a photovoltaic device having a small surface reflection loss may be manufactured.

A part of the laser beam is blocked by the aperture 7 while forming the plurality of openings 10 at the same time, and hence processing throughput is improved.

Embodiment 2

A method for manufacturing a photovoltaic device according to Embodiment 2 of the present invention is different from the method for manufacturing the photovoltaic device according to Embodiment 1 of the present invention in Step 2. In Step S2 according to Embodiment 1, the plurality of openings 10 formed in the etching-resistant film 2 are provided at rectangular grid points. In contrast to this, in Step 2 according to Embodiment 2, the openings 10 formed in the etching-resistant film 2 are provided at triangular grid points. The others are the same, and hence the same portions are expressed by the same reference numerals and thus the description is omitted.

FIG. 5 illustrates a relationship between the openings (outer circumferences are indicated by the solid lines in FIG. 5(a)) 10 formed in the etching-resistant film 2 and etching holes (outer circumferences are indicated by the broken lines in FIG. 5(a)) 11 formed by etching the silicon substrate 1. FIG. 5(a) is a plan view illustrating the silicon substrate 1 viewed from the etching-resistant film 2 side. FIG. 5(b) is a cross sectional view taken along the line A-A of FIG. 5(a). Further, in Embodiment 2, the openings 10 are disposed in an in-plane close-packed arrangement. Also, similarly to Embodiment 1, the diameter of the openings 10 is set so as to be smaller than the center distance between the adjacent openings 10.

Next, a contribution to reduction in surface reflection in the case where the openings 10 are provided at rectangular grid points as in Embodiment 1 is compared with a contribution to reduction in surface reflection in the case where the openings 10 are provided at triangular grid points as in Embodiment 2. When the openings 10 are provided at rectangular grid points, as illustrated in FIG. 3, the outlines of the etching holes 11 adjacent to each other in each of the longitudinal and lateral directions are in contact with each other. In contrast to this, the outlines of the etching holes 11 adjacent to each other in each of the diagonal directions are not in contact with each other, and hence the flat terrace portion 12 remains.

As illustrated in FIG. 6, when etching is further continued, as compared with the case of FIG. 3, until the outlines of the etching holes 11 adjacent to each other in each of the diagonal directions are in contact with each other (see FIG. 6(a)), the etching holes 11 adjacent to each other in each of the longitudinal and lateral directions overlap each other more than necessary, and hence a mountain 14 of the overlap portion becomes lower (see FIG. 6(b)). Therefore, when there are the terrace portion 12 and the low mountain 14, the reduction in surface reflection is limited.

On the other hand, in the case where the openings 10 are provided at triangular grid points, as illustrated in FIGS. 5(a) and 5(b), all the six etching holes 11 adjacent to each other in each of the longitudinal, lateral, and diagonal directions are located at the same distance. Therefore, even when etching is continued to be performed until the flat terrace portion is eliminated, the lowering of the mountain between the adjacent etching holes may be suppressed to minimum, to thereby contribute to the reduction in surface reflection.

To be specific, the openings 10 were provided such that the diameter of the openings 10 of the etching-resistant film 2 was set to 5 μm and a pitch between the adjacent openings 10 was set to 15 μm. After that, the silicon substrate 1 was etched using a hydrofluoric acid-nitric acid mixture solution, and then the etching-resistant film 2 was removed. Then, a surface reflection spectrum was measured using an integrating-sphere spectrophotometer. As a result, a reflectance of a substrate subjected to only alkali processing was 26% in a visible region. In contrast to this, a reflectance of the silicon substrate processed in Embodiment 2 was 8%. Thus, a reflectance suppression effect of 18% was found.

Embodiment 3

A method for manufacturing a photovoltaic device according to Embodiment 3 of the present invention is different from the method for manufacturing the photovoltaic device according to Embodiment 1 in Step 2. The others are the same, and hence the same portions are expressed by the same reference numerals and thus the description is omitted. In Step 2 according to Embodiment 1, multi-point irradiation is performed using the aperture 7. In Step 2 according to Embodiment 3, the silicon substrate 1 is scanned by a galvano-mirror with a laser beam condensed into a spot shape, to form the openings in the etching-resistant film 2.

Figure 7:
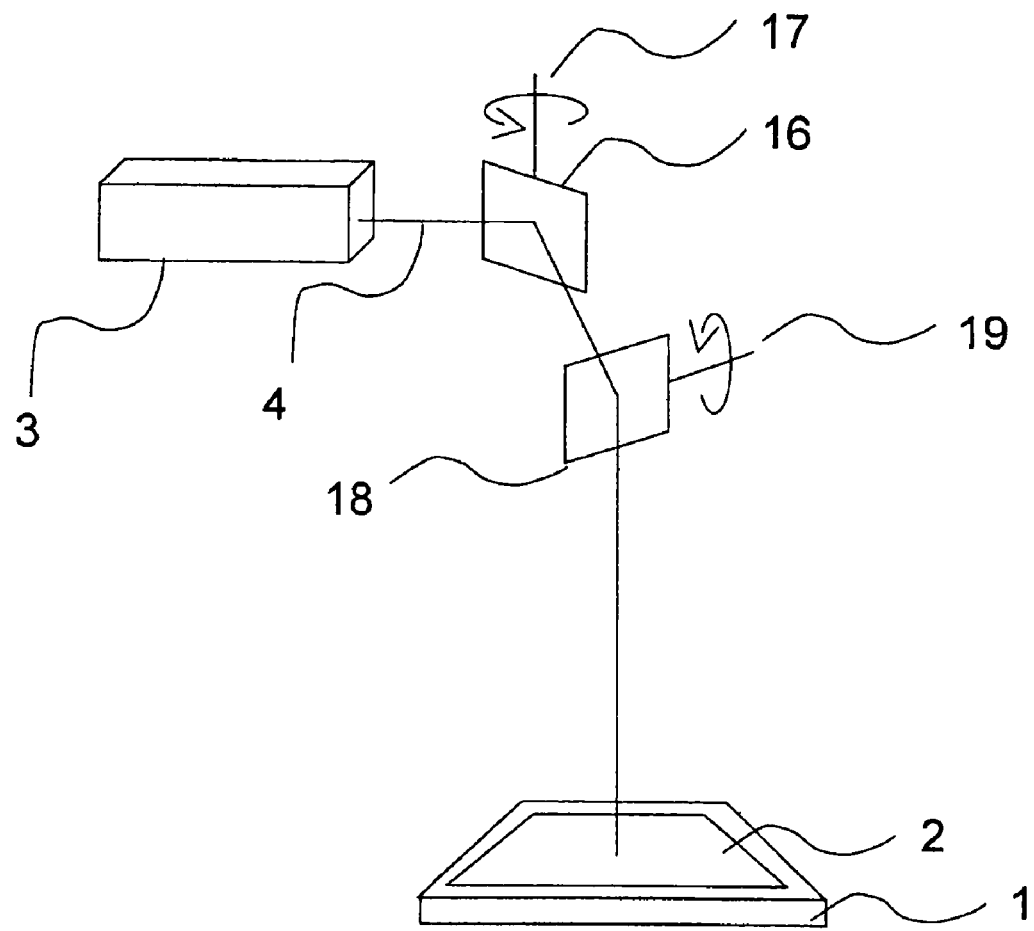
FIG. 7 An explanatory diagram illustrating an optical system of an apparatus for forming the plurality of openings in the etching-resistant film, which is used for a method for manufacturing a photovoltaic device according to Embodiment 3 of the present invention.

FIG. 7 is an explanatory diagram illustrating an optical system of an apparatus for forming the plurality of openings in the etching-resistant film, which is used for a method for manufacturing a photovoltaic device according to Embodiment 3 of the present invention. As illustrated in FIG. 7, in the apparatus for forming the plurality of openings 10 in the etching-resistant film 2, the laser beam 4 emitted from the laser oscillation device 3 is reflected on a galvano-mirror 16 for scanning in an X-axis direction 17. The reflected laser beam 4 is reflected on a galvano-mirror 18 for scanning in a Y-axis direction 19. Then, the etching-resistant film 2 located on the silicon substrate 1 is irradiated with the reflected laser beam.

As described above, when the galvano-mirror 16 for X-axis scanning and the galvano-mirror 18 for Y-axis scanning are rotated, the openings 10 may be formed in the entire region of the silicon substrate 1 at high speed. To be specific, the laser beam 4a having a repetition frequency of 500 kHz was used. In order to form 10,000 openings 10 per scanning line at a pitch of 15 μm, a scanning frequency of the galvano-mirror in the X-axis direction was set to 50 Hz. In order to form the openings at triangular grid points in a close-packed arrangement, it is necessary to set a scanning line interval in the Y-direction to 13 μm, and hence a scanning rate in the Y-direction on the surface of the substrate was set to 0.65 mm/seconds. Thus, the openings each having a diameter of 5 μm were formed in the etching-resistant film 2 at the pitch of 15 μm in the close-packed arrangement. After that, the silicon substrate 1 was etched using a hydrofluoric acid-nitric acid mixture solution. Then, the etching-resistant film 2 was removed.

As described above, the etching-resistant film 2 is scanned with the laser beam by a galvano-meter to form the plurality of openings. Thus, processing throughput is improved.

The invention claimed is:

1. A method for manufacturing a photovoltaic device, comprising:
   forming an etching-resistant film on a silicon substrate;
   forming a plurality of fine holes in the etching-resistant film and forming recesses in the silicon substrate at bottom portions of the plurality of fine holes by irradiating a laser beam of an intensity capable of removing the etching-resistant film and forming the recesses in the silicon substrate which is a base layer; and
   isotropically etching the silicon substrate through the plurality of fine holes.

2. The method for manufacturing a photovoltaic device according to claim 1, wherein
   the laser beam includes a laser beam having an adjusted focal depth equal to or larger than 10 μm.

3. The method for manufacturing a photovoltaic device according to claim 1, wherein
   a diameter of each of the fine holes is smaller than a center distance between the fine holes adjacent to each other.

4. The method for manufacturing a photovoltaic device according to claim 1, wherein
   the plurality of fine holes formed in the etching-resistant film are provided at rectangular grid points.

5. The method for manufacturing a photovoltaic device according to claim 1, wherein
   the plurality of fine holes formed in the etching-resistant film are provided at triangular grid points.

6. The method for manufacturing a photovoltaic device according to claim 1, wherein
   the formation of the plurality of fine holes comprises:
      forming the plurality of fine holes simultaneously by irradiating the laser beam through a light shielding mask having a light transmission portion and a light blocking portion which correspond to the plurality of fine holes.

7. The method for manufacturing a photovoltaic device according to claim 1, wherein
   the formation of the plurality of fine holes comprises:
      forming the plurality of fine holes by scanning the etching-resistant film with the laser beam by a galvano-mirror.

8. The method for manufacturing a photovoltaic device according to claim 1, wherein
   the isotropic etching comprises formation of etched holes each of which have a shape close to a hemisphere or a shape close to a spheroid in the silicon substrate.

9. The method for manufacturing a photovoltaic device according to claim 1, wherein
the formation of the plurality of fine holes and recesses comprises: forming the recesses so that a ratio of a depth to an aperture diameter of each of the etched holes formed by the isotropic etching is greater than 0.5.

10. The method for manufacturing a photovoltaic device according to claim 1, wherein
a diameter of each of the plurality of fine holes and recesses in the substrate is equal to or smaller than 2 μm.

11. The method for manufacturing a photovoltaic device according to claim 1, wherein
the etching-resistant film comprises a silicon nitride film, and
the laser beam comprises a third harmonic of a Nd:YAG laser.

12. The method for manufacturing a photovoltaic device according to claim 11, wherein an intensity of the laser beam is equal to or greater than 2 J/cm$^2$.

* * * * *